United States Patent
Shim

(10) Patent No.: US 7,312,157 B2
(45) Date of Patent: Dec. 25, 2007

(54) METHODS AND APPARATUS FOR CLEANING SEMICONDUCTOR DEVICES

(75) Inventor: Joon Bum Shim, Seongnam-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 144 days.

(21) Appl. No.: 10/918,047

(22) Filed: Aug. 13, 2004

(65) Prior Publication Data
US 2005/0112899 A1    May 26, 2005

(30) Foreign Application Priority Data
Nov. 25, 2003    (KR) .................. 10-2003-0083865

(51) Int. Cl.
*H01L 21/302* (2006.01)
(52) U.S. Cl. ............... 438/726; 438/727; 438/728; 438/730; 438/732
(58) Field of Classification Search ........... 216/107, 216/73, 78, 105; 134/1.3; 438/710, 723, 438/726, 727, 728, 730, 732
See application file for complete search history.

(56) References Cited

U.S. PATENT DOCUMENTS

| | | | |
|---|---|---|---|
| 5,336,356 A * | 8/1994 | Ban et al. ............... 156/345.26 |
| 5,744,402 A * | 4/1998 | Fukazawa et al. .......... 438/734 |
| 5,954,911 A | 9/1999 | Bergman et al. |
| 6,065,481 A | 5/2000 | Fayfield et al. |
| 6,299,724 B1 | 10/2001 | Fayfield et al. |
| 6,329,293 B1 * | 12/2001 | Tien et al. .................. 438/706 |
| 6,841,467 B2 * | 1/2005 | Inoue ......................... 438/623 |

OTHER PUBLICATIONS

Wolf, Silicon Processing for the VLSI Era, 2002, Lattice Press, vol. 4, p. 643.*
Definition of the term "solution" using http://dictionary.reference.com/browse/solution ; 2 pages; 2006.*

* cited by examiner

*Primary Examiner*—Binh X. Tran
(74) *Attorney, Agent, or Firm*—Saliwanchik, Lloyd & Saliwanchik

(57) ABSTRACT

Methods and apparatus for cleaning a semiconductor device are disclosed. A disclosed method comprises forming a capping layer on top of a substrate including a bottom interconnect layer; depositing and patterning an insulating layer on the capping layer to form a damascene structure; etching a portion of the capping layer exposed by the damascene structure; and (d) removing polymers and copper impurities due to the etching by using a HF vapor gas.

7 Claims, 3 Drawing Sheets

METHODS AND APPARATUS FOR
CLEANING SEMICONDUCTOR DEVICES

FIELD OF THE DISCLOSURE

The present disclosure relates generally to semiconductor fabrication and, more particularly to methods and apparatus for cleaning semiconductor devices.

BACKGROUND

Conventionally, a thin film of pure aluminum or its alloy has been used as a material to interconnect wires in semiconductor devices. The aluminum interconnect provides high conductivity, a simple process for generating patterns, strong adhesion with a silicon insulating layer and a low cost method for fabricating an interconnect in semiconductor devices. However, in pursuit of high integration in fabricating integrated circuits, the area of a unit cell of a semiconductor device has gradually been reduced. As a result, the area on which an interconnect is made is also decreased. This reduction in area results in the diminution of the operation speed of the device. A copper interconnect is, therefore, used to improve and maintain the operation speed in the semiconductor device. Because the copper interconnect cannot be directly etched at present, a damascene process and a CMP process are sequentially performed to fabricate the copper interconnect.

However, during the etching process of a nitride layer to form a contact hole and to connect an upper copper interconnect with a bottom copper connection, the bottom copper interconnect may be etched together with the nitride layer. The etching of the bottom copper interconnect may cause sputtering and generate copper ions and nitride polymers. The copper ions and nitride polymers may contaminate the surface of the substrate.

According to the conventional method, polymers from the silicon nitride layer of a capping layer are removed by an HF solvent. However, the copper contaminants are not completely removed by this process, but instead remain on the substrate and eventually affect the operation of the semiconductor device. High integration in semiconductor devices thus necessitates a transition of the material to insulate a copper interconnect from $SiO_2$ to a low dielectric material such as SiOC, and this requires new cleaning methods and apparatus.

Bergman, U.S. Pat. No. 5,954,911, describes a method and an apparatus using a vapor phase process stream made from a liquid phase source and feed gas.

Fayfield et al., U.S. Pat. No. 6,065,481, describes a method and an apparatus for direct delivery of an enabling chemical gas from a liquid source and of HF gas in a HF/enabling chemical based cleaning or etching process such as a silicon dioxide film etching process. The liquid enabling chemical is temperature controlled to generate a vapor pressure which is sufficient to operate a mass flow controller at a desired processing pressure without a carrier gas.

Fayfield et al., U.S. Pat. No. 6,299,724, describes an apparatus and method for direct delivery of an enabling chemical gas from a liquid source and of HF gas in a HF/enabling chemical based cleaning or etching process such as a silicon dioxide film etching process. The liquid enabling chemical is temperature controlled to generate a vapor pressure which is sufficient to operate a mass flow controller at a desired processing pressure without a carrier gas. However, the method described in the '724 Patent requires a prolonged process time due to its complexity.

Silicon glass, (e.g., a kind of $SiO_2$), is used as an insulating layer to form a conventional damascene structure. However, the conventional insulating layer in the copper interconnect has an RF delay problem due to the miniaturization of the copper interconnect. This delay problem is a main reason why a low dielectric material such as SiOC is substituted for $SiO_2$ in order to form an insulating layer. These low dielectric materials, however, make it impossible to use the prior art cleaning methods in which organic solvents or diluted HF solution are used as a cleaning solution.

DETAILED DESCRIPTION

Figure 1:
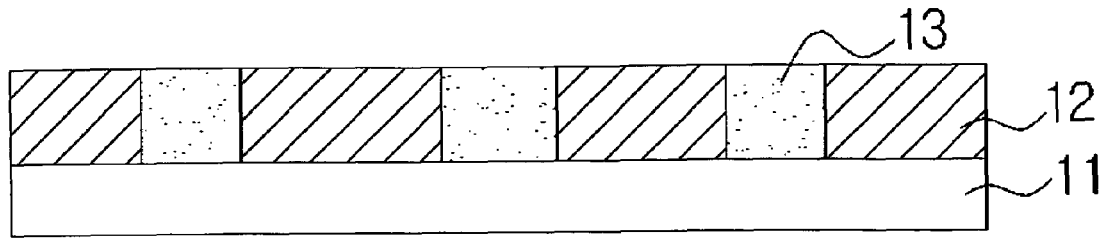
FIG. 1 through FIG. 5 are cross-section views illustrating an example process of forming a copper interconnect through a damascene process performed in accordance with the teachings of the present invention.

FIG. 1 through FIG. 5 are cross-section views illustrating an example process of forming a copper interconnect through a damascene process. FIG. 1 is a cross sectional view illustrating the formation of a bottom interconnect layer. In the example of FIG. 1, an insulating layer 12 is formed and patterned on a substrate 11 including at least one device. A copper interconnect is then deposited through an electroplating process. The copper interconnect is then planarized through a CMP (Chemical Mechanical Polishing) process to form a bottom interconnect layer 13.

Figure 2:
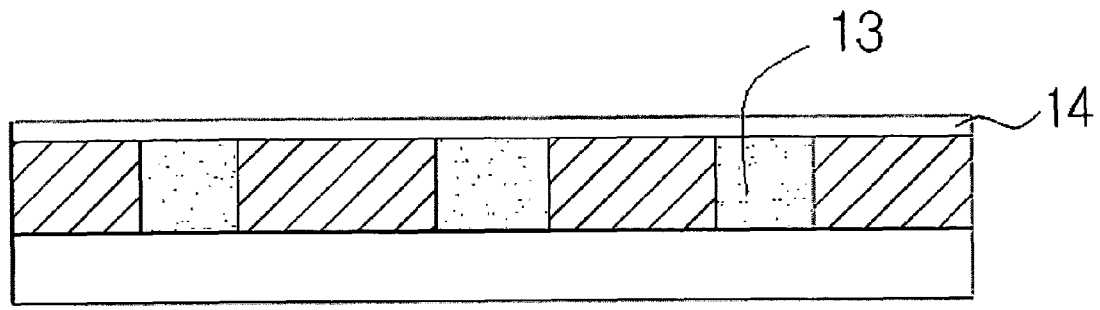

FIG. 2 is a cross sectional view illustrating the formation of a capping layer 14 on top of the bottom interconnect layer 13. More specifically, in the example of FIG. 2, the bottom insulating layer 13 is separated from an upper insulating layer by a capping layer 14 made of a silicon nitride. Because copper ions have the highest diffusion tendency of all metals used in semiconductor devices, a decrease in the reliability and the operatibility may occur in semiconductor devices when using copper as an interconnect. To prevent such performance degradation, the capping layer 14 prevents the diffusion of the copper ions. The thickness of the capping layer 14 preferably falls in a range between about 300 Å and about 600 Å.

Figure 3:
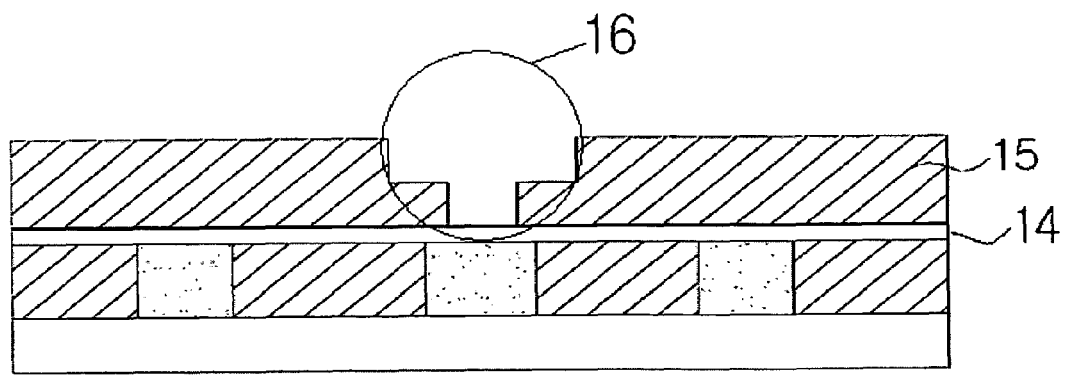

FIG. 3 is a cross sectional view illustrating the formation of a damascene structure 16 through the deposition and patterning of an upper insulating layer 15 on top of the capping layer 14. More specifically, in the example of FIG. 3, an upper insulating layer 15 with a low dielectric constant is deposited on top of the capping layer 14 through a CVD (Chemical Vapor Deposition) process. A damascene structure 16 is then formed by applying a dry-etching process to the upper insulating layer 15.

Any of a number of different methods may be used to form the damascene structure 16. For instance, a first example method comprises depositing an insulating layer on a substrate and forming a trench through patterning the insulating layer, depositing and patterning a photoresist on the whole area of the substrate including the trench, then, while using the patterned photoresist as a mask, forming a contact hole by removing the insulating layer in order to expose a predetermined portion of the substrate, and thereafter eliminating the photoresist to complete the damascene structure.

A second example method to form the damascene structure comprises depositing an insulating layer on a substrate, depositing and patterning a photoresist on the insulating layer, forming a contact hole by selectively removing a portion of the insulating layer in order to expose a predetermined portion of the substrate, depositing and patterning a photoresist on the whole area of the substrate including the contact hole, then, while using the patterned photoresist as a mask, forming a trench having a predetermined depth by eliminating the exposed insulating layer, and eliminating the photoresist to thereby complete a damascene structure.

A third example method to form a dual damascene structure comprises sequentially depositing a first insulating layer and an etch-stop layer on a substrate, depositing and patterning a photoresist on the etch-stop layer, selectively removing a portion of the etch stop layer in order to expose a predetermined portion of the first insulating layer, forming a second insulating layer on the resulting structure including the etch stop layer, depositing and patterning a photoresist on the second insulating layer, then, while using the patterned photoresist as a mask, selectively removing the second insulating layer, eliminating the photoresist; and forming a contact hole by removing the second insulating layer and the etch stop layer through blanket etching in order to expose a predetermined portion of the substrate to thereby complete a dual damascene structure.

Figure 4:
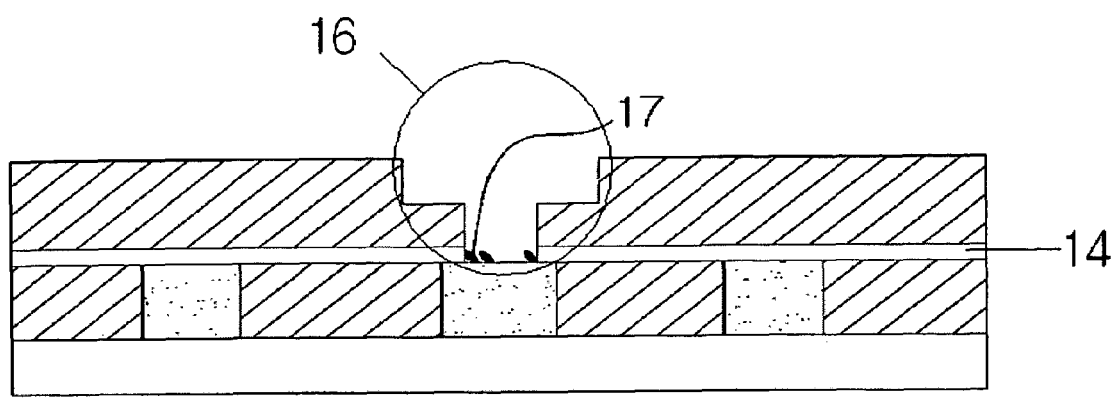

Referring to FIG. 4, the capping layer 14 exposed by the damascene process is etched. In particular, after the damascene structure 16 is completed, the silicon nitride layer, which is used as the capping layer 14 between the bottom interconnect with the upper interconnect, is eliminated through dry etching. Copper ions and silicon nitride polymers 17 are generated by the dry etching process for the silicon nitride layer 14. During the dry etching process for the silicon nitride layer 14, the bottom copper layer is exposed and the copper ions are sputtered all over the surface of the wafer. Some of the copper ions are removed by a later cleaning process, but others are not. Therefore, residual copper ions still remain on the insulating layer during later processes. The silicon nitride polymers 17 and copper ions affect the reliability and the operatibility of semiconductor devices. In the conventional methods, an organic solvent including HF and diluted HF solution are used to remove the polymers and copper contaminants. However, as the degree of integration increases in semiconductor devices, the organic solvent including HF and diluted HF solution may no longer be used as a cleaning solution due to the change of the insulating material from $SiO_2$ to a low dielectric material. Accordingly, the methods and apparatus to use vaporized HF in order to clean the substrate are disclosed herein.

Figure 6:
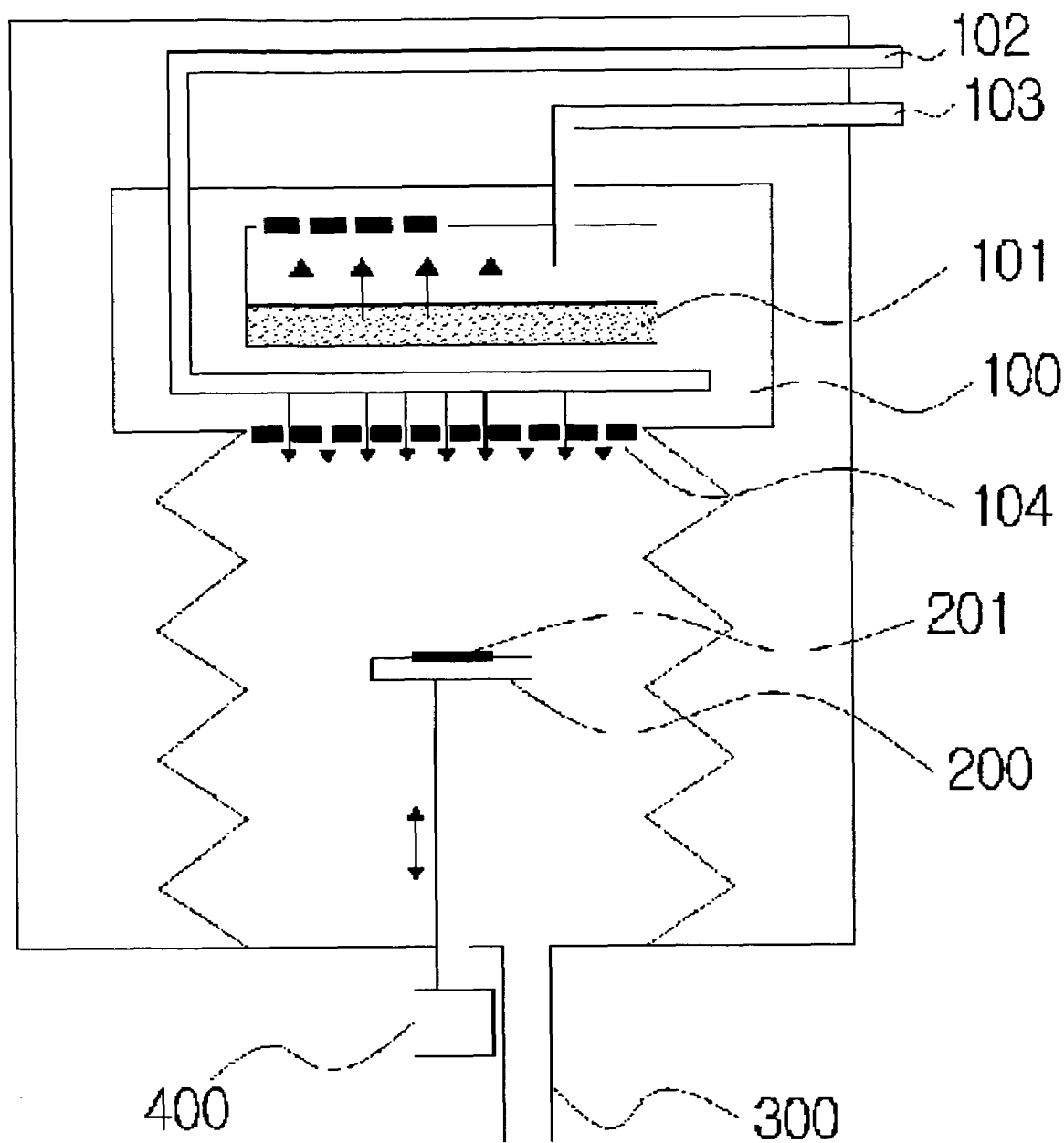
FIG. 6 is a schematic diagram illustrating an example apparatus for cleaning a semiconductor device using a HF vapor gas.

FIG. 6 is a schematic diagram of an example apparatus for cleaning semiconductor devices using HF vapor gas. The illustrated apparatus comprises a gas generating part 100 for making HF vapor, a spray nozzle for spaying the HF vapor gas, a hot plate 200 positioned a distance under the spray nozzle to maintain the temperature of the substrate, and a gas discharge part 300 for exhausting the HF vapor to the outside.

The gas generating part 100 of the illustrated apparatus comprises a solution storage part 101 to store the HF solution, a high temperature gas injection port 103 to supply a high temperature gas to the HF solution in order to make a HF vapor, a gas injection port 102 to supply a gas with which the HF vapor is combined, and a spray nozzle 104 for spraying the HF vapor gas mixture on the substrate. The high temperature gas is preferably made of $N_2$ or an inert gas, and the HF solution preferably contains about 30 mol % to about 40 mol % HF. The temperature of the gas sprayed from the nozzle 104 is preferably kept in a range between about 40° C. and about 90° C.

The hot plate 200 preferably maintains the temperature of the substrate 201 in a range between about 60° C. and about 80° C. Increasing the temperature of the substrate 201 to the temperature range mentioned above minimizes the etched area in the insulating layer and activates the polymers for reaction with the HF vapor.

In the illustrated example, the gas discharge part 300 is a pipe for exhausting gases. A recycling means is preferably mounted to separate unreacted HF vapor gas from exhausted $N_2$ gas during the etching process.

In the illustrated example, the moving device 400 moves the hot plate 200 upward and downward to maintain a fixed distance between the substrate 201 and the spray nozzle 104 from which the HF vapor gas is sprayed.

Figure 5:
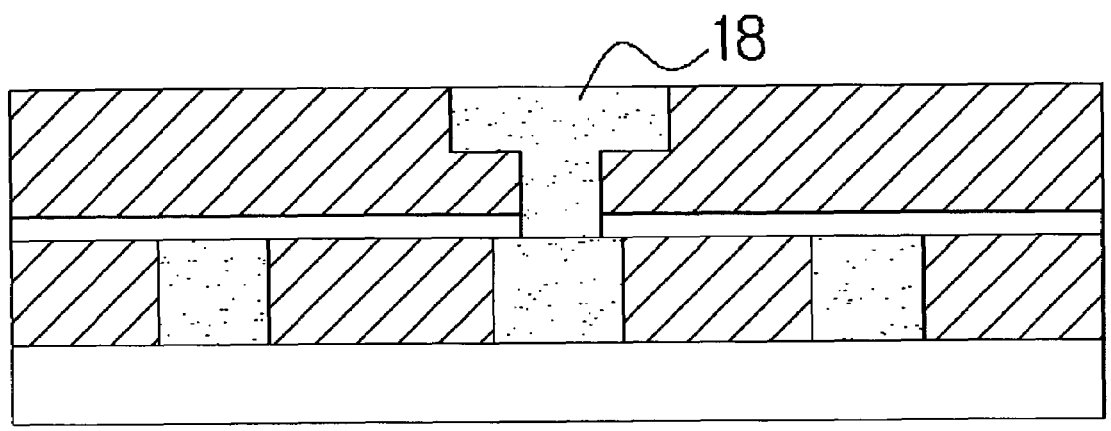

Referring to FIG. 5, the cleaning apparatus using HF vapor removes the residual impurities 17 from the substrate including the exposed bottom interconnect. An upper interconnect layer 18 is then formed by depositing a copper interconnect by electroplating and then planarizing the interconnect 18 by a CMP process.

In view of the foregoing, persons of ordinary skill in the art will appreciate that methods and apparatus to clean a substrate with a dual damascene structure by using a HF vapor have been disclosed. The disclosed methods and apparatus effectively remove copper impurities and silicon nitride polymers to thereby prevent an increase in contact resistivity and a decrease in operatibility. In addition, the disclosed methods and apparatus can diminish the process time by eliminating impurities through a successive process following the etching of the capping layer 14.

From the foregoing, persons of ordinary skill in the art will further appreciate that methods and apparatus for cleaning a semiconductor device have been disclosed. The disclosed methods and apparatus obtain a desired size of a contact hole and a copper interconnect by removing silicon nitride polymers and copper impurities while protecting a low dielectric insulating layer by using a HF vapor gas as a cleaning agent.

An illustrated example method for cleaning a semiconductor device comprises forming a capping layer 14 on top of a substrate including a bottom interconnect layer 13, depositing and patterning an insulating layer 15 on the capping layer 14 to form a damascene structure, etching an exposed portion of the capping layer 14 and removing polymers and copper impurities due to the etching process by using a HF vapor gas.

An illustrated example apparatus for cleaning semiconductor devices comprises a gas generator 100 to make an HF vapor gas, a spray nozzle 104 to spray the HF vapor gas, a hot plate 200 positioned a distance under the spray nozzle 104 to maintain the temperature of the substrate, and a gas discharge port 300 to exhaust the HF vapor to the outside.

This patent claims priority from Korean Patent Application Serial No. 10-2003-0083865 which was filed on Nov. 25, 2003 and which is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for cleaning a semiconductor device comprising:

forming a capping layer on top of a substrate including a bottom interconnect layer;

depositing and patterning an insulating layer on the capping layer to form a damascene structure;

etching a portion of the capping layer exposed by the damascene structure; and removing polymers and copper impurities due to the etching by using a HF vapor gas, wherein the HF vapor gas is vaporized by supplying $N_2$ or an inert gas supplied through a high temperature gas injection port to a HF solution in a cleaning apparatus, wherein the high temperature gas injection port supplies $N_2$ or an inert gas of a temperature to vaporize the HF solution, and wherein the HF vapor gas is vaporized in a gas generating part, where the gas generating part is positioned vertically above the substrate.

2. A method as defined by claim 1, wherein the capping layer is made of silicon nitride and has a thickness of between about 300 Å and about 600 Å.

3. A method as defined by claim 1, wherein the insulating layer is made of a low dielectric material through a CVD process.

4. A method as defined by claim 1, wherein the capping layer is etched through a dry etching process.

5. A method as defined by claim 1, wherein the HF solution is about 30 mol % to about 40 mol % HF.

6. A method as defined by claim 1, wherein the temperature of the substrate is maintained between about 60° C. and about 80° C. when removing the polymers and the copper impurities.

7. A method as defined by claim 1, wherein a temperature of the HF gas is kept between about 40° C. and about 90° C.

* * * * *